United States Patent
Shvarts

(10) Patent No.: US 7,236,541 B1
(45) Date of Patent: Jun. 26, 2007

(54) TRANSLATION LOOP MODULATOR

(75) Inventor: Alexander Shvarts, deceased, late of Arlington, MA (US); by Tanya Bulkoushteyn, legal representative, Arlington, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/325,099

(22) Filed: Jun. 3, 1999

(51) Int. Cl.
   *H04L 27/04* (2006.01)
(52) U.S. Cl. .................................................... 375/295
(58) Field of Classification Search ............... 375/261,
   375/285, 295, 296, 298, 303, 305, 306, 307,
   375/308, 373, 375, 376; 332/100, 103, 117,
   332/126, 127, 128, 144; 455/23, 42, 75,
   455/76, 85, 86, 110, 552.1, 553.1; 370/206,
   370/275; 359/182, 183; 331/1 A, 1 R, 2,
   331/4, 12, 23, 46, 47
   See application file for complete search history.

(56) References Cited

U.S. PATENT DOCUMENTS

| | | | | |
|---|---|---|---|---|
| 3,958,186 A | * | 5/1976 | Jesse et al. ..................... | 331/4 |
| 4,021,757 A | | 5/1977 | Nossen ........................ | 332/101 |
| 5,130,670 A | * | 7/1992 | Jaffe ............................ | 331/2 |
| 5,130,676 A | | 7/1992 | Mutz ........................... | 332/100 |
| 5,313,173 A | * | 5/1994 | Lampe ......................... | 332/103 |
| 5,966,055 A | * | 10/1999 | Knoedl et al. ................ | 332/103 |
| 6,157,271 A | * | 12/2000 | Black et al. ................. | 332/127 |
| 6,208,875 B1 | * | 3/2001 | Damgaard et al. .......... | 455/552.1 |

FOREIGN PATENT DOCUMENTS

| DE | 197 43 207 C1 | | 9/1997 |
|---|---|---|---|
| DE | 0905879 A1 | * | 3/1999 |
| EP | 0 905 878 A2 | | 3/1999 |
| WO | WO 95/16304 | | 6/1995 |

* cited by examiner

*Primary Examiner*—Kevin Kim
(74) *Attorney, Agent, or Firm*—Gauthier & Connors, LLP

(57) ABSTRACT

A translation loop modulator for a transmission circuit in a communication system includes an input modulation unit for receiving at least one input signal that is representative of information to be modulated. The input modulation unit also receives a feedback signal, produces an intermediate modulated signal responsive to the input signal and the feedback signal. The modulator also includes a comparator unit that receives the intermediate modulated signal and a reference signal, and produces an output transmission signal responsive to the intermediate modulated signal and the reference signal. The modulator also includes feedback circuitry that is coupled to the output transmission signal, and to the reference signal. The feedback circuitry is also coupled to the input modulation unit and produces the feedback signal responsive to the output transmission signal and the reference signal.

18 Claims, 3 Drawing Sheets

TRANSLATION LOOP MODULATOR

BACKGROUND OF THE INVENTION

The invention relates to the field of transmitters for radio frequency communication systems, and particularly relates to transmitters including constant envelope modulation systems.

As wireless communication systems have become increasingly popular, a demand has developed for less expensive yet spectrally clean radio frequency (RF) transmitters having constant envelope modulation systems. High quality RF transmitters typically include relatively expensive components. For example, certain bandpass filters, such as surface acoustic wave (SAW) filters provide excellent performance yet are relatively expensive. Many applications further require transmitters that exhibit low power consumption. It is also desirable that transmitters be suitable for use with any of a plurality of standards for modulation, e.g., global system for mobile communication (GSM) or digital cellular system (DCS).

Constant envelope modulation systems including translation loop modulators are known to provide circuits having relatively less expensive filtering requirements. Translation loop modulators generally include a feedback loop in communication with the output oscillator that is coupled to a transmission antenna. The feedback loop permits the circuit itself to provide bandpass filtering since the output signal may be locked to a given center frequency.

A conventional translation loop modulation system is shown in FIG. 1. The system includes quadrature modulation circuitry 12, phase comparitor circuitry 14, a voltage controlled oscillator (VCO) 16 coupled to an output antenna (not shown), a feedback coupler 17, and a feedback path 18. Input signals representative of the information to be modulated and transmitted may be applied to the I and Q channels of the quadrature modulator. The input signals may be modulated to adjust the phase or angle of a reference signal. This phase information is converted to a voltage signal by the phase comparitor circuitry 14, and the voltage signal is then converted to a frequency signal by the VCO 16. The feedback path 18 provides a phase locked loop to lock the VCO 16 to a given center frequency.

It is conventionally known that transmitter circuits should be designed to reduce the possibility of spurious signals (e.g., harmonics as well as foreign signals) being introduced into the system. In certain situations, the origin of some spurious signals may be extremely difficult to predict, and may be nearly impossible to simulate. To address this problem, it is conventionally believed that transmitter circuits of the type shown in FIG. 1 should be designed to be flexible so that the frequency plan may be adjusted to remove any noise from the band of interest.

For example, in certain situations, a circuit may be most easily corrected by adjusting the frequency of either the voltage controlled oscillator 20 in the phase comparitor circuitry, or the voltage controlled oscillator 22 in the feedback path. Employing two separate oscillators facilitates adjustment for reducing noise since either may be adjusted independent of the other. Moreover, the frequencies may be chosen so as to not be harmonically related, which minimizes the chance of harmonic spurious signals being produced by the oscillators.

Unfortunately, however, some oscillators are rather expensive. For example, certain oscillator circuits that are formed of synthesizers produce very stable output signals, but are relatively expensive. It is also desirable that the use of relatively expensive filters be avoided.

There is a need, therefore, for inexpensive yet efficient constant envelope modulation systems. There is further a need for a translation loop modulator that is spectrally efficient yet economical to produce.

SUMMARY OF THE INVENTION

The invention provides a translation loop modulator that is relatively inexpensive yet provides spectrally clean performance. In an embodiment, one VCO only is employed to produce both the reference signal for the phase comparator circuitry as well as for the feedback path. A translation loop modulator of the invention includes an input modulation unit for receiving at least one input signal that is representative of information to be modulated. The input modulation unit also receives a feedback signal, and produces an intermediate modulated signal responsive to the input signal and the feedback signal. The modulator also includes a comparator unit that receives the intermediate modulated signal and a reference signal, and produces an output transmission signal responsive to the intermediate modulated signal and the reference signal. The modulator also includes feedback circuitry that is coupled to the output transmission signal, and to the reference signal. The feedback circuitry is also coupled to the input modulation unit and produces the feedback signal responsive to the output transmission signal and the reference signal.

BRIEF DESCRIPTION OF THE DRAWINGS

The following detailed description may be further understood with reference to the accompanying drawings in which.

DETAILED DESCRIPTION OF THE INVENTION

Figure 1:
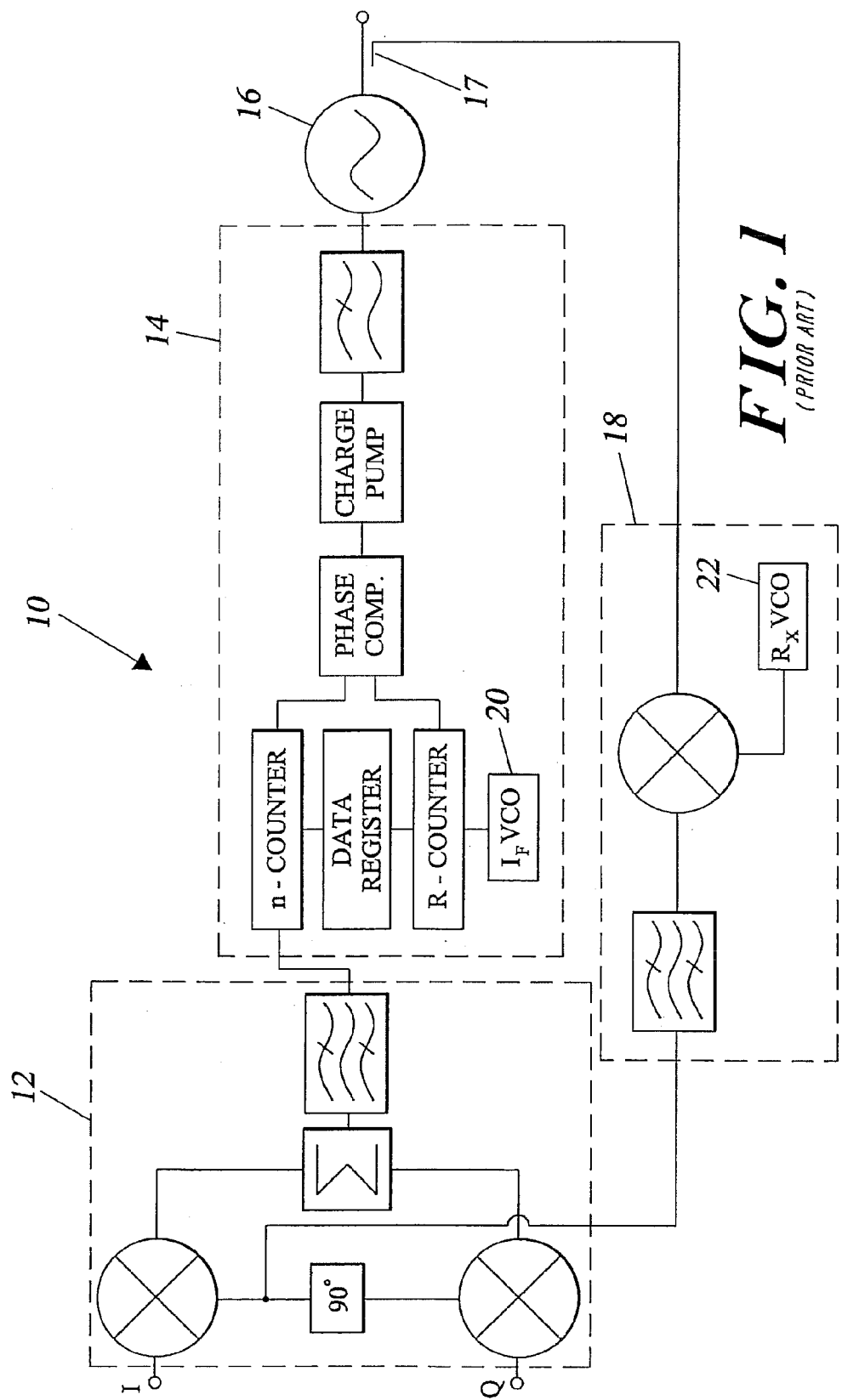
FIG. 1 shows a functional block diagram of a conventional translation loop modulator.
Figure 2:
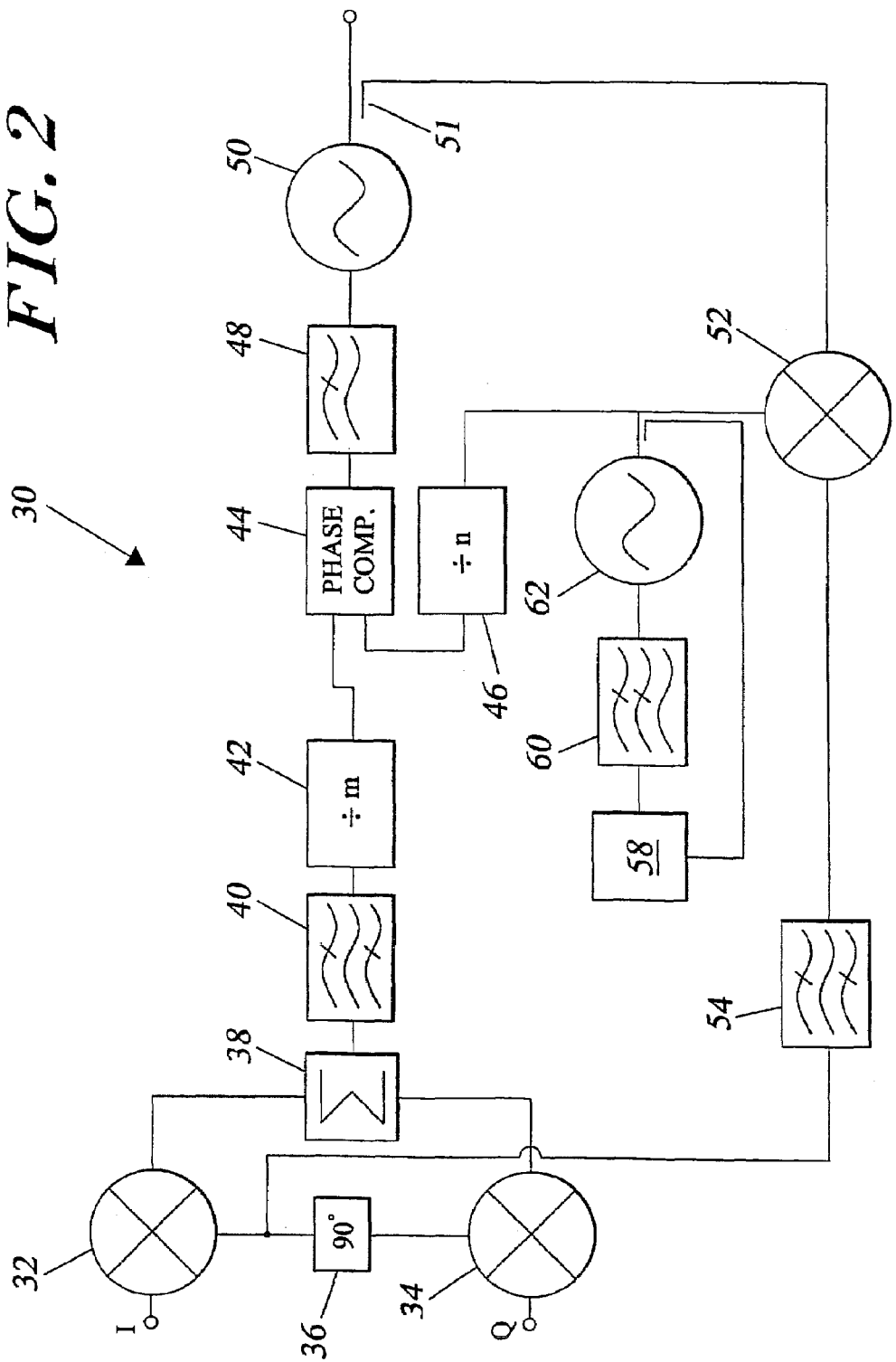
FIG. 2 shows a functional block diagram of an embodiment of a translation loop modulator of the invention.

As shown in FIG. 2, a system 30 of an embodiment of the invention includes quadrature mixer circuitry including two mixers 32 and 34, a phase shift device 36, a summing device 38 and a bandpass filter 40. One input signal to the first mixer 32 is the I channel (or In-Phase channel) input modulation signal, and the other is a feedback signal 64 without a phase shift. The output of the mixer 32 is coupled to the summing device 38. One input signal to the second mixer 34 is the Q channel (or Quadrature channel) input modulation signal, and the other is a phase shifted feedback signal that is produced by the phase shift device 36. In other embodiments, various combinations of phase shifting may be employed to achieve quadrature modulation of the input signals. The output of the mixer 34 is combined with the output of the mixer 32 at the summing device 38 to produce a combined signal. This combined signal is filtered by bandpass filter 40 to produce a quadrature modulation signal. The quadrature modulation signal is coupled to phase comparator circuitry.

The phase comparator circuitry of the embodiment shown in FIG. 2 includes an m frequency divider 42, a phase comparator device 44, an n frequency divider 46, and a low pass filter 48. The quadrature modulation signal is input to the m frequency divider 42. The phase comparator device receives one input from the output of the m frequency divider 42, and the other input from the n frequency divider 46. The output of the phase comparator device 44 is coupled to a low pass filter 48, the output of which is coupled to an output VCO 50. The VCO 50 produces the transmitter output signal, and is coupled to a power amplifier (not shown) as well as an antenna (not shown).

A feedback signal is provided to feedback circuitry by a coupler 51 that is positioned in the output signal path of the VCO 50 as shown. The feedback circuitry includes a downconverter mixer 52 and a bandpass filter 54. One input of the downconverter mixer 52 is the output signal of the output VCO 50, and the other input signal is a local oscillator signal 56. The output of the downconverter mixer 52 is coupled to the bandpass filter 54, the output of which provides the feedback signal 64. The function of the downconverter mixer 52 is to translate the frequency of the output signal to an intermediate frequency for further processing in the loop.

The local oscillator signal 56 that is input to the downconverter mixer 52 is also input to the n frequency divider 46. In an embodiment, this signal 56 is produced by a fractional n synthesizer 58, a loop filter 60 and a VCO 62, all of which are connected in a feedback loop configuration. Specifically, the output of the fractional n synthesizer is coupled via the bandpass filter to the VCO 62. The output of the VCO 62 produces the local oscillator signal 56, and this output signal is fed back to the fractional n synthesizer. The invention provides, therefore, that one VCO only may provide an oscillator signal to both the phase comparator circuitry and to the downconverter mixer in the feedback circuitry. This is achieved through careful selection of components.

The circuit provides that the frequency of the transmitter output signal ($RF_{OUT}$) may be related to the frequency of the local oscillator. In particular, we are concerned with the high side and low side products of the mixer, and because it's a downconverter, we are concerned with the difference product IF=|RF−LO|. For GSM, therefore, $RF_{LO}/n = (RF_{LO} - RF_{OUT})/m$, where $RF_{LO} - RF_{OUT}$ is the high side difference product. Solving for $RF_{OUT}$, $RF_{OUT} = RF_{LO}(1-m/n)$ which provides that $RF_{LO} = RF_{OUT}/(1-m/n)$. For DCS, $RF_{LO}/n = (RF_{OUT} - RF_{LO})/m$, where $RF_{OUT} - RF_{LO}$ is the low side difference product. Solving for $RF_{OUT}$, $RF_{OUT} = RF_{LO}(1+m/n)$ or $RF_{LO} = RF_{OUT}/(1+m/n)$. The values of m and n may be chosen such that the transmitter output signal may be at 900 MHz for GSM, and may be at 1800 MHz for DCS. This may be achieved by recognizing that $RF_{OUT} = RF_{LO} + RF_{IF}$ for DCS and $RF_{OUT} = RF_{LO} - RF_{IF}$ for GSM where $RF_{IF}$ is the frequency of the intermediate frequency signal, which is the feedback signal to the quadrature modulator.

During operation, the output of the phase comparator 44 provides a dc voltage responsive to the phase difference between two input signals of the same frequency. For example. the input signals to the phase comparator 44 may each be 225 MHz in frequency. If m=2 and n=6, then the signal input to the m frequency divider 42 must be 450 MHz in frequency, and the signal input to the n frequency divider 46 must be 1350 MHz. For GSM, the output signal produced by the transmit oscillator will be 900 MHz in frequency. This signal is output to the transmitter antenna (not shown). For these values of m and n, therefore, $RF_{LO} = \frac{3}{2} RF_{OUT}$ for GSM, $RF_{LO} = \frac{3}{4} RF_{OUT}$ for DCS.

The output signal is also coupled to the downconverter mixer 52 as the R input. The local oscillator input signal will be at a frequency of 1350 MHz. Since a mixer will produce signals having frequencies at the sum as well as at the difference between the frequencies of the two input signals, the output of the mixer 52 produces two signals, one having a frequency of 2250 MHz, and another having a frequency of 450 MHz. For example, the product of two sine functions $\sin(\alpha) \times \sin(\beta)$ equals $\frac{1}{2} \cos(\alpha-\beta) - \frac{1}{2} \cos(\alpha+\beta)$. The two frequencies produced at the output therefore would be $F_1 + F_2$ and $F_1 - F_2$. The 2250 MHz signal is filtered out at the filter 54, and the quadrature modulator circuit receives a feedback signal at 450 MHz.

By controlling I and Q, the phase (or angle) of the 450 MHz signal that is input to the m divider 42 may be precisely controlled. For example, if zero volts is applied on the Q input and one volt is applied to the I input, then the signal provided to the divider circuitry would be a 450 MHz signal at zero degrees. If zero volts is applied on the Q input and negative one volt on the I input, then the quadrature output signal would be a 450 MHz signal at 180 degrees. If one volt is applied on the Q input and zero volts on I input, then the output signal would be a 450 MHz signal at 90 degrees. If negative one volt is applied on the Q input and zero volts is applied to the I input, then the output signal would be a 450 MHz signal at −90 degrees. By adjusting the I and Q inputs, the angle of the 450 MHz signal may be fully adjusted.

The quadrature modulator therefore provides the modulation for the RF output signal. The output of the phase comparator produces a signal at the frequency of the sum of the inputs, as well as a signal at a frequency of the difference between the inputs. The signal at the sum frequency (450 MHz) is filtered out at the filter 48, and the dc signal (zero MHz.) is input to the voltage controlled oscillator, which in turn, produces the output signal for the antenna. The filter 48 also, among other functions, filters any other noise that may develop in the system.

With proper selection of the VCO 62, the filters 40, 48, and 54, and the values of the frequency dividers 42 and 46, a translation loop modulator circuit may be provided that achieves the objectives of the invention. In other embodiments, the values of m and n may be different. The invention permits the elimination of one oscillator in a translation loop modulator circuit without significant degradation of performance characteristics.

Figure 3:
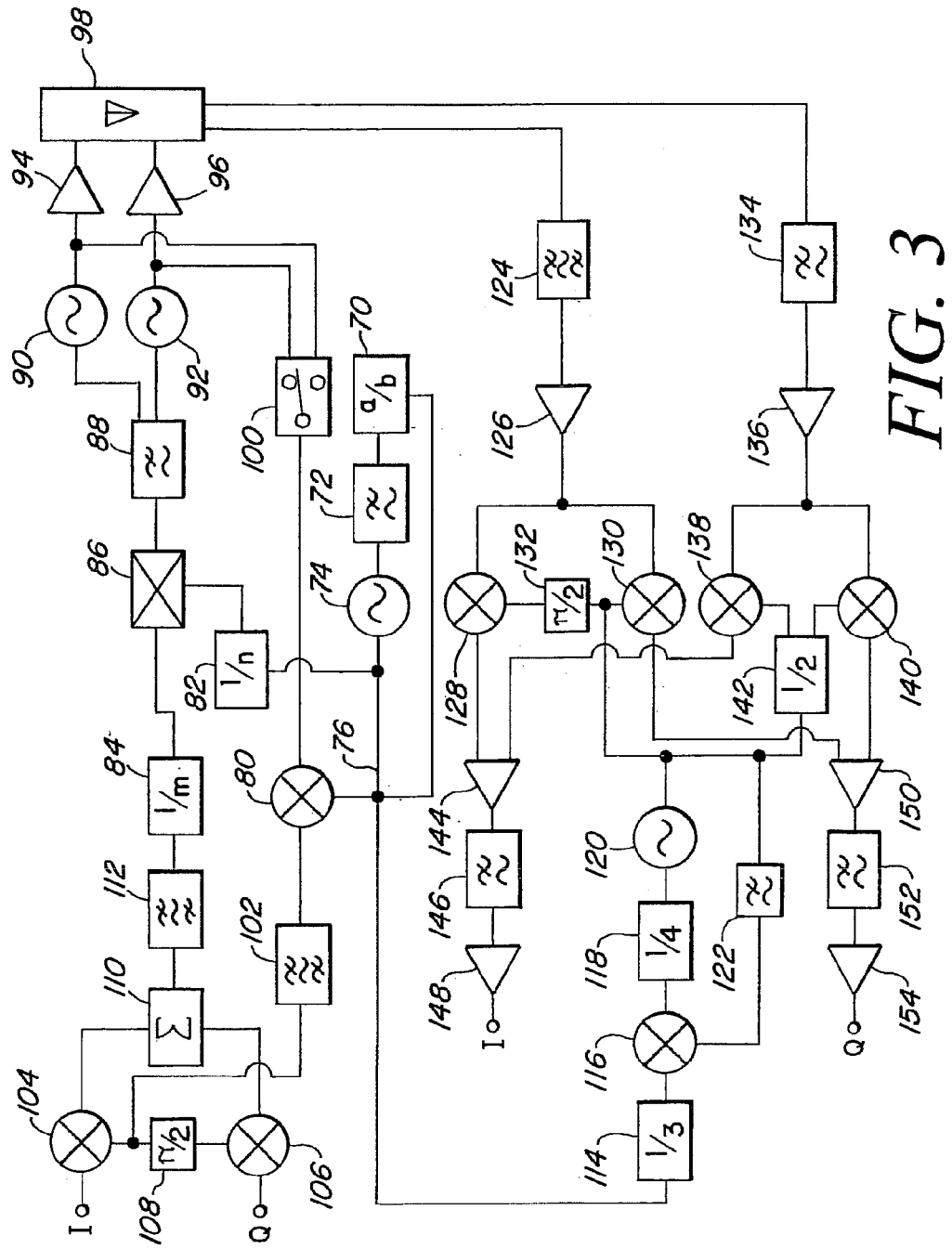
FIG. 3 shows a functional block diagram of a transmission and reception system incorporating a translation loop modulator in accordance with another embodiment of the invention.

As shown in FIG. 3, a transmitter/receiver system including a translation loop modulator of the invention includes a fractional n synthesizer 70, a low pass loop filter 72 and a VCO 74, the output of which is a local oscillator signal 76. The local oscillator signal 76 is fed back to the fractional n synthesizer, is input to a downconverter mixer 80 in a feedback path of the transmitter circuit, and is input to an n frequency divider 82 of a phase comparator portion as shown. The phase comparator portion also includes an m frequency divider 84, a phase comparator and charge pump device 86, and a filter 88.

The output of the filter 88 is coupled to a pair of VCOs 90 and 92, each of which is in turn coupled to an amplifier 94 and 96 respectively, and finally an output antenna 98. The transmitter output may be switched between each output path to provide operation at of two transmission standards. The two chosen transmission standards may be any of a variety of standards, e.g., GSM and DCS.

The feedback path includes a matching or switching device that alternately receives input signals from the output of one or the other of the VCOs 90 or 92. The output of the device 100 is presented as in input to the downconverter mixer 80. The output of the mixer 80 is coupled, via a bandpass filter 102, to the quadrature modulator components as a feedback signal. The quadrature modulator components include I and Q channel mixers 104, 106, a phase shift device 108, a summation device 110, and bandpass filter 112 as shown.

The operation of the translation loop modulator of FIG. 3 is similar to that discussed above with reference to the embodiment shown in FIG. 2. The local oscillator output signal 76 of the system of FIG. 3, however, is also fed to a receiver circuit in the system of FIG. 3. In particular, the local oscillatory signal 76 is coupled, via a frequency divider 114 (e.g., divide by 3), to an oscillator loop including a mixer 116, another frequency divider 118 (e.g., divide by 4), a VCO 120, and a low pass loop filter 122. The output of the VCO 120 is also coupled to each of two signal receive paths, e.g., one for GSM and the other for DCS systems.

The first signal receive path from the antenna 98 is coupled, via a bandpass filter 124 (e.g., SAW) and an amplifier 126 to a quadrature demodulation circuit including a pair of mixers 128 and 130, as well as a phase shift device 132 which provides, for example, a zero and a 90 degrees phase shift of the VCO 120 oscillator signal. The other signal path from the antenna 98 similarly includes a bandpass filter 134 (e.g., SAW) and an amplifier 136 in communication with a pair of mixers 138 and 140. The quadrature components of the second signal path include a frequency divider 142 (e.g., divide by 2) which provides the VCO 120 oscillator signal with a frequency divided by 2 to each mixer 138 and 140.

The outputs of mixers 128 and 138 are presented to a phase comparitor device 144, which is coupled via a low pass filter 146 to an amplifier 148 to provide the I channel receiver output. The output of mixers 130 and 140 are presented to a phase comparitor device 150, which is coupled via a low pass filter 152 to an amplifier 154 to provide the Q channel receiver output.

During operation, the reference signal produced by the oscillator 74 is provided to the phase comparator circuitry of the transmitter, to the down converter mixer of the transmitter, and to the frequency divider 114 of the receiver circuitry. The reference signal is used by a loop oscillator circuit to provide a receiver reference signal for the quadrature demodulators of the receiver circuitry. The receiver reference signal is used with zero and 90 degrees phase shift to produce the I channel signal, and is used with the frequency divider 142 to produce the Q channel signal as shown.

Those skilled in the art will appreciate that numerous modifications and variations may be made to the above disclosed embodiments without departing from the spirit and scope of the invention.

What is claimed is:

1. A translation loop modulator for a transmission circuit in a communication system having a first mode of operation at a first frequency and a second mode of operation at a second frequency, said translation loop modulator comprising:

input modulation means for receiving at least one input signal that is representative of information to be modulated, for receiving a feedback signal, and for producing an intermediate modulated signal responsive to said input signal and said feedback signal;

comparator means for receiving said intermediate modulated signal and a reference signal having a frequency of $F_{LO}$, and for producing an output transmission signal having a frequency $F_{OUT}$ responsive to said intermediate modulated signal, wherein said comparator means includes a first frequency divider unit for providing a divide by m function and a second frequency divider unit for providing a divide by n function such that $F_{LO}=F_{OUT}/(1+m/n)$ in said first mode of operation and $F_{LO}=F_{OUT}/(1-m/n)$ in said second mode of operation; and feedback circuitry coupled to said output transmission signal, coupled to said reference signal and coupled to said input modulation means, said feedback circuitry for producing said feedback signal responsive to said output transmission signal and said reference signal.

2. A translation loop modulator as claimed in claim 1 further comprising a reference loop modulator for producing said reference signal.

3. A translation loop modulator as claimed in claim 2, wherein said reference loop modulator includes a fractional n synthesizer.

4. A translation loop modulator as claimed in claim 1, wherein an input port of said second frequency divider unit is coupled to said reference signal, and an output port of said second frequency divider unit is coupled to a phase comparator device.

5. A translation loop modulator as claimed in claim 1, wherein an input port of said first frequency divider unit is coupled to said intermediate modulated signal, and an output port of said first frequency divider unit is coupled to a phase comparator device.

6. A translation loop modulator as claimed in claim 1, wherein said feedback circuitry includes a mixer device including a first input port coupled to said output transmission signal, a second input port coupled to said reference signal, and an output port coupled to said feedback signal.

7. A translation loop modulator as claimed in claim 6, wherein said reference signal is directly connected to said mixer device.

8. A translation loop modulator for a transmission circuit in a communication system having a first mode of operation at a first frequency and a second mode of operation at a second frequency, said translation loop modulator comprising:

quadrature modulation means for receiving at least one input signal that is representative of information to be modulated, for receiving a feedback signal, and for producing an quadrature modulated signal responsive to said input signal and said feedback signal;

phase comparator means for receiving said quadrature modulated signal and a reference signal having a frequency $F_{LO}$, and for producing a phase comparator signal responsive to said quadrature modulated signal and said reference signal, said phase comparator means including a first frequency divider unit for providing a divide by m function and a second frequency divider unit for providing a divide by n function;

oscillator means for receiving said phase comparator signal, and for producing an output transmission signal responsive to said phase comparator signal, said output transmission signal having a frequency $F_{OUT}$ wherein $F_{LO}=F_{OUT}/(1+m/n)$ in said first mode of operation and $F_{LO}=F_{OUT}/(1-m/n)$ in said second mode of operation; and feedback circuitry coupled to said output transmission signal, coupled to said reference signal and coupled to said quadrature modulation means, said feedback circuitry for producing said feedback signal responsive to said output transmission signal and said reference signal.

9. A translation loop modulator as claimed in claim 8 further comprising a reference loop modulator for producing said reference signal.

10. A translation loop modulator as claimed in claim 9, wherein said reference loop modulator includes a fractional n synthesizer.

11. A translation loop modulator as claimed in claim 8, wherein an input port of said second frequency divider unit is coupled to said reference signal, and an output port of said second frequency divider unit is coupled to a phase comparator device.

12. A translation loop modulator as claimed in claim 8, wherein an input port of said first frequency divider unit is coupled to said intermediate modulated signal, and an output port of said first frequency divider unit is coupled to a phase comparator device.

13. A translation loop modulator as claimed in claim 8, wherein said feedback circuitry includes a mixer device including a first input port coupled to said output transmission signal, a second input port coupled to said reference signal, and an output port coupled to said feedback signal.

14. A translation loop modulator as claimed in claim 13, wherein said reference signal is directly connected to said mixer device.

15. A translation loop modulator for a transmission circuit in a communication system having a first mode of operation at a first frequency and a second mode of operation at a second frequency, said translation loop modulator comprising:

quadrature modulation means for receiving at least one input signal that is representative of information to be modulated, for receiving a feedback signal, and for producing an quadrature modulated signal responsive to said input signal and said feedback signal;

first frequency divider means for receiving said quadrature modulated signal, and for producing a first frequency divided signal responsive to said quadrature modulated signal such that said first frequency divider means provides a divide by m function;

second frequency divider means for receiving a reference signal having a frequency $F_{LO}$, and for producing a second frequency divided signal responsive to said reference signal such that said second frequency divider means provides a divide by n function;

phase comparator means for receiving said first frequency divided signal and said second frequency divided signal, and for producing a phase comparator signal responsive to said first and second frequency divided signals;

oscillator means for receiving said phase comparator signal, and for producing an output transmission signal having a frequency $F_{OUT}$ responsive to said phase comparator signal such that $F_{LO}=F_{OUT}/(1+m/n)$ in said first mode of operation and $F_{LO}=F_{OUT}/(1-m/n)$ in said second mode of operation; and feedback circuitry coupled to said output transmission signal, coupled to said reference signal and coupled to said quadrature modulation means, said feedback circuitry for producing said feedback signal responsive to said output transmission signal and said reference signal.

16. A translation loop modulator as claimed in claim 15 further comprising a reference loop modulator for producing said reference signal.

17. A translation loop modulator as claimed in claim 15, wherein said first mode of operation is at about 1800 MHz.

18. A translation loop modulator as claimed in claim 15, wherein said second mode of operation is at about 900 MHz.

\* \* \* \* \*